(12) United States Patent
Lee

(10) Patent No.: US 11,699,487 B2
(45) Date of Patent: Jul. 11, 2023

(54) SEMICONDUCTOR MEMORY DEVICE PERFORMING READ OPERATION, AND METHOD FOR THE SEMICONDUCTOR MEMORY DEVICE

(71) Applicant: SK hynix Inc., Icheon-si (KR)

(72) Inventor: Hee Youl Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 3 days.

(21) Appl. No.: 17/468,397

(22) Filed: Sep. 7, 2021

(65) Prior Publication Data

US 2022/0310163 A1   Sep. 29, 2022

(30) Foreign Application Priority Data

Mar. 29, 2021   (KR) .................. 10-2021-0040474

(51) Int. Cl.
| | |
|---|---|
| G11C 16/04 | (2006.01) |
| G11C 16/08 | (2006.01) |
| G11C 16/24 | (2006.01) |
| G11C 16/26 | (2006.01) |

(52) U.S. Cl.
CPC .......... *G11C 16/08* (2013.01); *G11C 16/0483* (2013.01); *G11C 16/24* (2013.01); *G11C 16/26* (2013.01)

(58) Field of Classification Search
CPC ..... G11C 16/08; G11C 16/0483; G11C 16/24; G11C 16/26; G11C 16/3427

USPC .................................................... 365/185.23
See application file for complete search history.

(56) References Cited

U.S. PATENT DOCUMENTS

| | | | |
|---|---|---|---|
| 2017/0154680 A1* | 6/2017 | Lee | ............. G11C 16/0483 |
| 2018/0082731 A1* | 3/2018 | Lee | ............. H01L 27/0688 |
| 2018/0247697 A1* | 8/2018 | Lee | ............. G11C 16/10 |
| 2019/0189215 A1* | 6/2019 | Yang | ............. G11C 16/24 |

FOREIGN PATENT DOCUMENTS

| | | |
|---|---|---|
| KR | 101462488 B1 | 11/2014 |
| KR | 1020180080003 A | 7/2018 |

* cited by examiner

*Primary Examiner* — Tha-O H Bui
(74) *Attorney, Agent, or Firm* — William Park & Associates Ltd.

(57) ABSTRACT

A semiconductor memory device includes a cell string and a peripheral circuit. The cell string includes at least one drain select transistor that is connected to a bit line, at least one source select transistor that is connected to a common source line, and a plurality of memory cells that are connected between the drain select transistor and the source select transistor. The peripheral circuit performs a read operation on a selected memory cell among the plurality of memory cells. The peripheral circuit is configured to read data that is stored in the selected memory cell by applying a read voltage to a selected word line among word lines that are connected to the plurality of memory cells and by applying a pass voltage to unselected word lines, and configured to transmit a boosting prevention voltage to a channel region in the cell string while applying an equalizing voltage to the word lines.

12 Claims, 14 Drawing Sheets

SEMICONDUCTOR MEMORY DEVICE PERFORMING READ OPERATION, AND METHOD FOR THE SEMICONDUCTOR MEMORY DEVICE

CROSS-REFERENCE TO RELATED APPLICATION

The present application claims priority under 35 U.S.C. § 119(a) to Korean patent application number 10-2021-0040474 filed on Mar. 29, 2021, in the Korean Intellectual Property Office, the entire disclosure of which is incorporated by reference herein.

BACKGROUND

1. Technical Field

The present application relates to an electronic device, and more particularly, to a semiconductor memory device and a method of operating the same.

2. Related Art

A semiconductor memory device may be formed in a two-dimensional structure in which strings are horizontally arranged on a semiconductor substrate or in a three-dimensional structure in which the strings are vertically stacked on the semiconductor substrate. A three-dimensional memory device is a memory device that is designed to resolve the limitation of an integration degree of a two-dimensional memory device and may include a plurality of memory cells that are vertically stacked on a semiconductor substrate.

SUMMARY

According to an embodiment of the present disclosure, a semiconductor memory device includes a cell string and a peripheral circuit. The cell string includes at least one drain select transistor that is connected to a bit line, at least one source select transistor that is connected to a common source line, and a plurality of memory cells that are connected between the drain select transistor and the source select transistor. The peripheral circuit performs a read operation on a selected memory cell among the plurality of memory cells. The peripheral circuit is configured to read data that is stored in the selected memory cell by applying a read voltage to a selected word line among word lines that are connected to the plurality of memory cells and by applying a pass voltage to unselected word lines, and configured to transmit a boosting prevention voltage to a channel region in the cell string while applying an equalizing voltage to the word lines.

According to another embodiment of the present disclosure, a method of operating a semiconductor memory device comprising a cell string including at least one drain select transistor that is connected to a bit line, at least one source select transistor that is connected to a common source line, and a plurality of memory cells that are connected between the drain select transistor and the source select transistor includes applying a read voltage to a selected word line among a plurality of word lines that are respectively connected to the plurality of memory cells and applying a pass voltage to unselected word lines, and transmitting a boosting prevention voltage to a channel region in the cell string while applying an equalizing voltage to the plurality of word lines.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure is to provide a semiconductor memory device capable of preventing a read disturb and a method of operating the same.

The present technology may provide a semiconductor memory device capable of preventing a read disturb and a method of operating the same.

Figure 1:
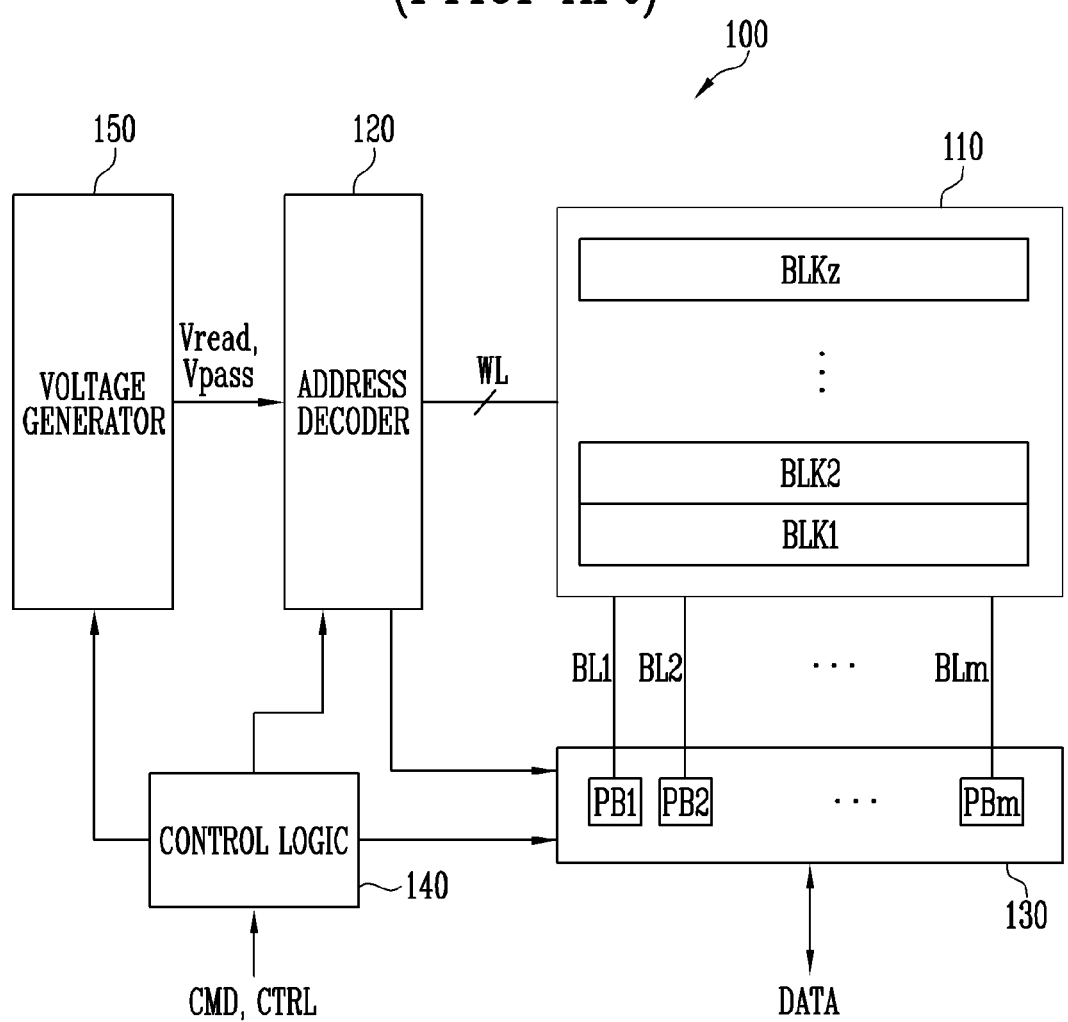
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, a control logic 140, and a voltage generator 150.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read and write circuit 130 through bit lines BL1 to BLm. Each of the plurality of memory blocks BLK1 to BLKz may include a plurality of memory cells. As an embodiment, the plurality of memory cells may be non-volatile memory cells, and may be configured of non-volatile memory cells with a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells that are included in the memory cell array may store at least one bit of data. In an embodiment, each of the plurality of memory cells that are included in the memory cell array 110 may be a single-level cell (SLC) that stores one bit of data. In another embodiment, each of the plurality of memory cells that are included in the memory cell array 110 may be a multi-level cell (MLC) that stores two bits of data. In still another embodiment, each of the plurality of memory cells that are included in the memory cell array 110 may be a triple-level cell that stores three bits of data. In still another embodiment, each of the plurality of memory cells that are included in the memory cell array 110 may be a quad-level cell that stores four bits of data. According to an embodiment, the memory cell array 110 may include a plurality of memory cells each that stores five or more bits of data.

The address decoder 120, the read and write circuit 130, and the voltage generator 150 may operate as a peripheral circuit that drives the memory cell array 110. At this time, the peripheral circuit may be operated under the control of the control logic 140. The address decoder 120 may be connected to the memory cell array 110 through the word lines WL. The address decoder 120 may be configured to operate in response to control of the control logic 140. The address decoder 120 may receive an address through an input/output buffer (not shown) inside the semiconductor memory device 100.

The address decoder 120 may be configured to decode a block address among received addresses. The address decoder 120 may select at least one memory block according to the decoded block address. In addition, the address decoder 120 may apply a read voltage Vread generated in the voltage generator 150 to a selected word line of the selected memory block at a time of a read voltage application operation during a read operation and may apply a pass voltage Vpass to the remaining unselected word lines. In addition, during a program verify operation, the address decoder 120 may apply a verify voltage generated in the voltage generator 150 to the selected word line of the selected memory block and may apply the pass voltage Vpass to the remaining unselected word lines.

The address decoder 120 may be configured to decode a column address of the received addresses. The address decoder 120 may transmit the decoded column address to the read and write circuit 130.

A read operation and a program operation of the semiconductor memory device 100 are performed in a page unit. Addresses that are received at a time of a request of the read operation and the program operation may include a block address, a row address, and a column address. The address decoder 120 may select one memory block and one word line according to the block address and the row address. The column address may be decoded by the address decoder 120 and may be provided to the read and write circuit 130.

The address decoder 120 may include a block decoder, a row decoder, a column decoder, an address buffer, and the like.

The read and write circuit 130 may include a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm may be connected to the memory cell array 110 through the bit lines BL1 to BLm. During the read operation and the program verify operation, in order to sense a threshold voltage of the memory cells, the plurality of page buffers PB1 to PBm may sense a change of the amount of current that is flowing according to a program state of a corresponding memory cell through a sensing node while continuously supplying a sensing current to the bit lines that are connected to the memory cells and may latch the sensed change as sensing data. The read and write circuit 130 may operate in response to page buffer control signals output from the control logic 140.

During the read operation, the read and write circuit 130 may sense the data of the memory cell, may temporarily store read data, and may output data DATA to the input/output buffer (not shown) of the semiconductor memory device 100. As an exemplary embodiment, the read and write circuit 130 may include a column selection circuit, and the like, in addition to the page buffers (or page registers).

The control logic 140 may be connected to the address decoder 120, the read and write circuit 130, and the voltage generator 150. The control logic 140 may receive a command CMD and a control signal CTRL through the input/output buffer (not shown) of the semiconductor memory device 100. The control logic 140 may be configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110. The control logic may control the voltage generator 150 to generate various voltages used during the program operation of the memory cell array 110. In addition, the control logic 140 may control the address decoder 120 to transfer the voltages generated by the voltage generator 150 to local lines of a memory block which is an operation target through global lines. Meanwhile, the control logic 140 may control the read and write circuit 130 to read data of a selected page of the memory block through the bit lines BL1 to BLm during the read operation and store the data in the page buffers PB1 to PBm. In addition, the control logic 140 may control the read and write circuit 130 to program the data, which is stored in the page buffers PB1 to PBm, in the selected page during the program operation.

The voltage generator 150 may generate the read voltage Vread and the pass voltage Vpass during the read operation in response to the control signal output from the control logic 140. In order to generate a plurality of voltages with various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

During the read operation of a typical semiconductor memory device, a floating channel may be formed in the cell string, and thus, a negative boosting phenomenon of a channel voltage may occur, by discharging a read voltage $V_{READ}$ or a pass voltage $V_{PASS}$ applied to the word line. While recovering the negative boosting of the channel voltage, positive boosting may occur toward the word line. Accordingly, a threshold voltage distribution of the memory cells may move in a positive direction, and thus a read disturb may occur during a subsequent read operation.

In accordance with a semiconductor memory device and a method of operating the same according to an embodiment of the present disclosure, a boosting prevention voltage may be transmitted to the cell string in an equalizing period after the read operation. The boost prevention voltage may be a voltage transmitted to maintain a channel voltage in the cell string. Accordingly, the negative boosting that occurs in the channel region of the cell string is minimized, and the positive boosting that occurs in the word line in the subsequent recovery step is also minimized. As a result, according to the present disclosure, the influence of the read disturb may be reduced by minimizing a movement width of the threshold voltage distribution of the memory cells.

Figure 2:
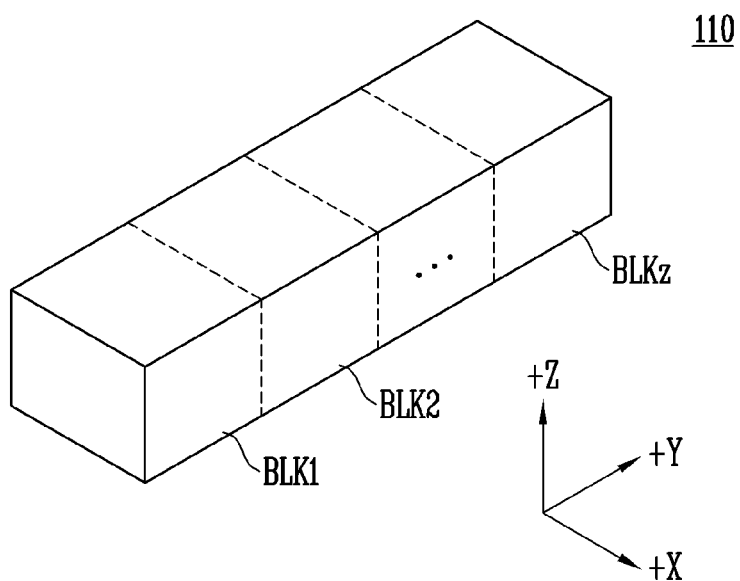
FIG. 2 is a block diagram illustrating an embodiment of a memory cell array 110 of FIG. 1.

FIG. 2 is a block diagram illustrating an embodiment of the memory cell array 110 of FIG. 1.

Referring to FIG. 2, the memory cell array 110 may include a plurality of memory blocks BLK1 to BLKz. Each memory block has a three-dimensional structure. Each memory block may include a plurality of memory cells stacked on a substrate. Such plurality of memory cells may be arranged along a +X direction, a +Y direction, and a +Z direction. A structure of each memory block is described in more detail with reference to FIGS. 3 and 4.

Figure 3:
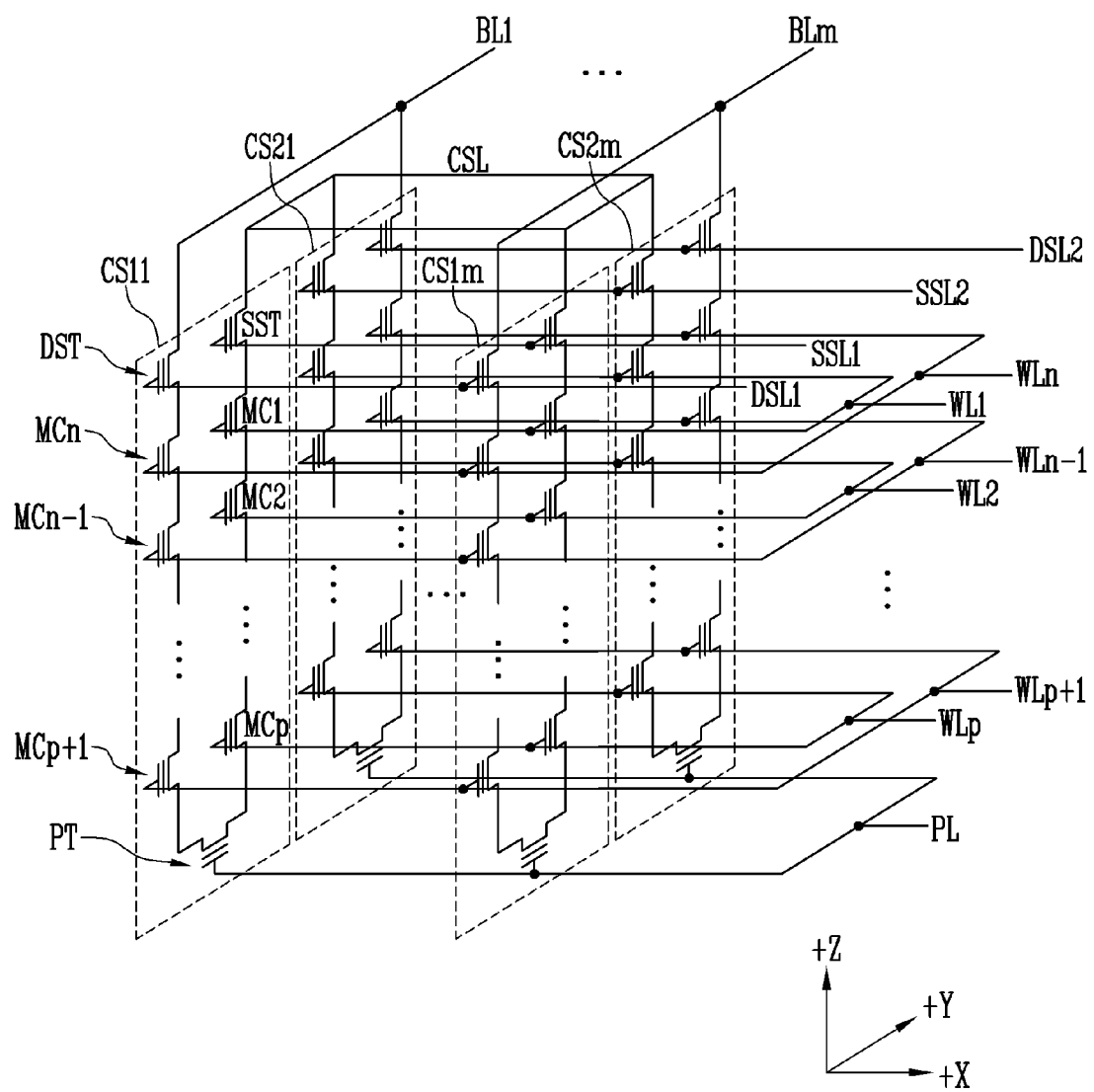
FIG. 3 is a circuit diagram illustrating any one memory block BLKa of memory blocks BLK1 to BLKz of FIG. 2.

FIG. 3 is a circuit diagram illustrating any one memory block BLKa of the memory blocks BLK1 to BLKz of FIG. 2.

Referring to FIG. 3, the memory block BLKa may include a plurality of cell strings CS11 to CS1*m* and CS21 to CS2*m*. As an embodiment, each of the plurality of cell strings CS11 to CS1*m* and CS21 to CS2*m* may be formed in a 'U' shape. In the memory block BLKa, m cell strings may be arranged in a row direction (that is, the +X direction). In FIG. 3, two cell strings may be arranged in a column direction (that is, the +Y direction). However, this is for convenience of description, and it may be understood that three or more cell strings may be arranged in the column direction.

Each of the plurality of cell strings CS11 to CS1*m* and CS21 to CS2*m* may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string may be connected between a common source line CSL and the memory cells MC1 to MCp.

As an embodiment, the source select transistors of the cell strings that are arranged in the same row may be connected to a source select line extending in the row direction, and the source select transistors of the cell strings that are arranged in different rows may be connected to different source select lines. In FIG. 3, the source select transistors of the cell strings CS11 to CS1*m* of a first row may be connected to a first source select line SSL1. The source select transistors of the cell strings CS21 to CS2*m* of a second row may be connected to a second source select line SSL2.

As another embodiment, the source select transistors of the cell strings CS11 to CS1*m* and CS21 to CS2*m* may be commonly connected to one source select line.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a direction opposite to the +Z direction, and may be connected in series between the source select transistor SST and the pipe transistor PT. The (p+1)-th to n-th memory cells MCp+1 to MCn may be sequentially arranged in the +Z direction, and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each cell string may be connected to the first to n-th word lines WL1 to WLn, respectively.

The gate of the pipe transistor PT of each cell string may be connected to a pipeline PL.

The drain select transistor DST of each cell string may be connected between a corresponding bit line and the memory cells MCp+1 to MCn. The cell strings that are arranged in the row direction may be connected to the drain select line extending in the row direction. The drain select transistors of the cell strings CS11 to CS1*m* of the first row may be connected to a first drain select line DSL1. The drain select transistors of the cell strings CS21 to CS2*m* of the second row may be connected to a second drain select line DSL2.

The cell strings that are arranged in the column direction may be connected to the bit lines extending in the column direction. In FIG. 3, the cell strings CS11 and CS21 of the first column may be connected to the first bit line BL1. The cell strings CS1*m* and CS2*m* of the m-th column may be connected to the m-th bit line BLm.

The memory cells that are connected to the same word line in the cell strings that are arranged in the row direction configure one page. For example, the memory cells that are connected to the first word line WL1, among the cell strings CS11 to CS1*m* of the first row configure one page. The memory cells that are connected to the first word line WL1, among the cell strings CS21 to CS2*m* of the second row may configure another page. The cell strings that are arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to CS2m that are arranged in the row direction may be connected to the even bit lines, and odd-numbered cell strings among the cell strings CS11 to CS1m or CS21 to CS2m that are arranged in the row direction may be connected to odd bit lines, respectively.

As an embodiment, at least one of the first to n-th memory cells MC1 to MCn may be used as a dummy memory cell. For example, at least one dummy memory cell may be provided to reduce an electric field between the source select transistor SST and the memory cells MC1 to MCp. Alternatively, at least one dummy memory cell may be provided to reduce an electric field between the drain select transistor DST and the memory cells MCp+1 to MCn. As more dummy memory cells are provided, the reliability of an operation for the memory block BLKa may be improved. However, the size of the memory block BLKa may increase. As less dummy memory cells are provided, the size of the memory block BLKa may be reduced. However, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage that is applied to dummy word lines that are connected to the respective dummy memory cells.

Figure 4:
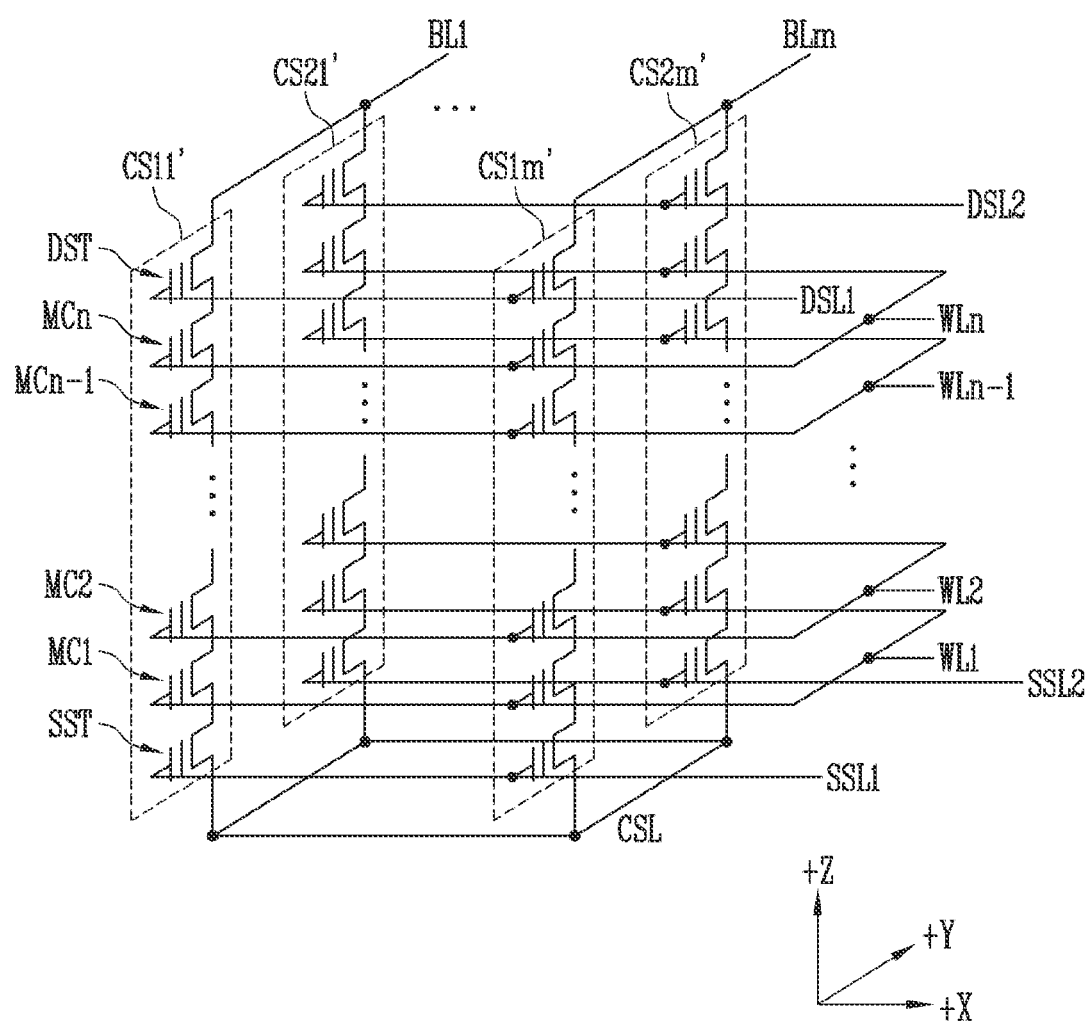
FIG. 4 is a circuit diagram illustrating another embodiment of any one memory block BLKb of the memory blocks BLK1 to BLKz of FIG. 2.

FIG. 4 is a circuit diagram illustrating another embodiment of any one memory block BLKb of the memory blocks BLK1 to BLKz of FIG. 2.

Referring to FIG. 4, the memory block BLKb may include a plurality of cell strings CS11' to CS1m' and CS21' to CS2m'. Each of the plurality of cell strings CS11' to CS1m' and CS21' to CS2m' may extend along a +Z direction. Each of the plurality of cell strings CS11' to CS1m' and CS21' to CS2m' may include at least one source select transistor SST, first to n-th memory cells MC1 to MCn, and at least one drain select transistor DST that are stacked on a substrate (not shown) under the memory block BLKb.

The source select transistor SST of each cell string may be connected between a common source line CSL and memory cells MC1 to MCn. The source select transistors of the cell strings that are arranged in the same row may be connected to the same source select line. The source select transistors of the cell strings CS11' to CS1m' that are arranged in a first row may be connected to a first source select line SSL1. The source select transistors of the cell strings CS21' to CS2m' that are arranged in a second row may be connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string may be connected in series between the source select transistor SST and the drain select transistor DST. The gates of the first to n-th memory cells MC1 to MCn may be connected to first to the n-th word lines WL1 to WLn, respectively.

The drain select transistor DST of each cell string may be connected between a corresponding bit line and the memory cells MC1 to MCn. The drain select transistors of the cell strings that are arranged in the row direction may be connected to a drain select line extending in the row direction. The drain select transistors of the cell strings CS11' to CS1m' of a first row may be connected to a first drain select line DSL1. The drain select transistors of the cell strings CS21' to CS2m' of a second row may be connected to a second drain select line DSL2.

As a result, the memory block BLKb of FIG. 4 has an equivalent circuit that is similar to that of the memory block BLKa of FIG. 3, except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' that are arranged in the row direction may be connected to even bit lines, and odd-numbered cell strings among the cell strings CS11' to CS1m' or CS21' to CS2m' that are arranged in the row direction may be connected to odd bit lines, respectively.

As an embodiment, at least one of the first to n-th memory cells MC1 to MCn may be used as a dummy memory cell. For example, at least one dummy memory cell may be provided to reduce an electric field between the source select transistor SST and the memory cells MC1 to MCn. Alternatively, at least one dummy memory cell may be provided to reduce an electric field between the drain select transistor DST and the memory cells MC1 to MCn. As more dummy memory cells are provided, the reliability of an operation for the memory block BLKb may be improved. However, the size of the memory block BLKb may increase. As less dummy memory cells are provided, the size of the memory block BLKb may be reduced. However, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage that is applied to the dummy word lines that are connected to the respective dummy memory cells.

Figure 5:
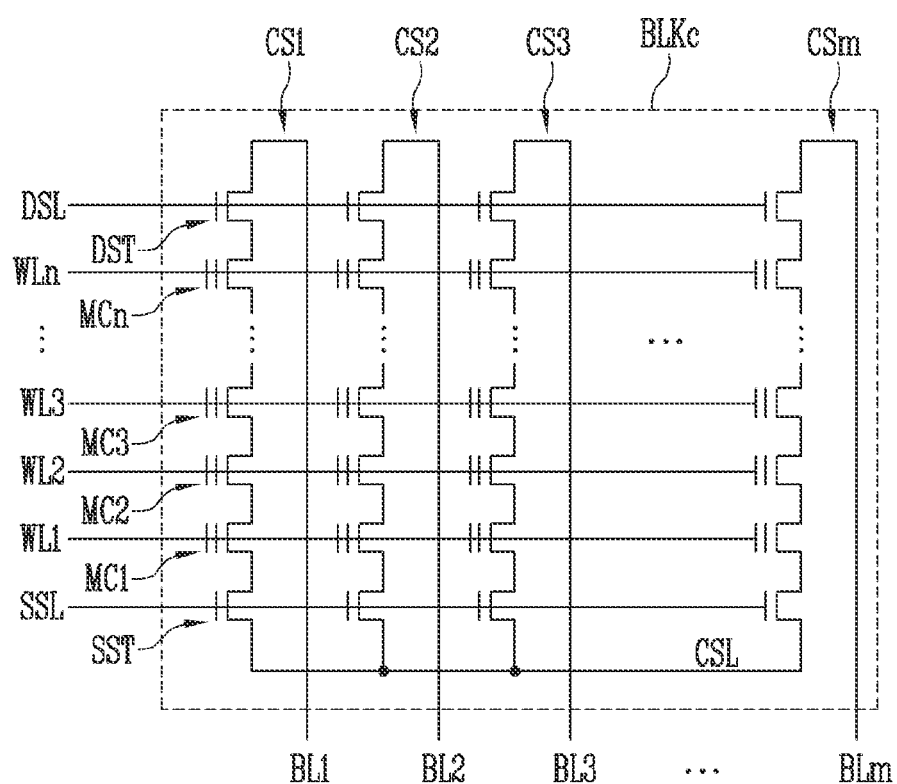
FIG. 5 is a circuit diagram illustrating an embodiment of any one memory block BLKc of the memory blocks BLK1 to BLKz included in the memory cell array 110 of FIG. 1.

FIG. 5 is a circuit diagram illustrating an embodiment of any one memory block BLKc of the memory blocks BLK1 to BLKz included in the memory cell array 110 of FIG. 1.

Referring to FIG. 5, the memory block BLKc may include a plurality of cell strings CS1 to CSm. The plurality of cell strings CS1 to CSm may be connected to a plurality of bit lines BL1 to BLm, respectively. Each of the cell strings CS1 to CSm may include at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string may be connected between a common source line CSL and the memory cells MC1 to MCn.

The first to n-th memory cells MC1 to MCn of each cell string may be connected between the source select transistor SST and the drain select transistor DST.

The drain select transistor DST of each cell string may be connected between a corresponding bit line and the memory cells MC1 to MCn.

Memory cells that are connected to the same word line configure one page. The cell strings CS1 to CSm may be selected by selecting the drain select line DSL. One page among the selected cell strings may be selected by selecting any one of the word lines WL1 to WLn.

As another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As shown in FIGS. 2 to 4, the memory cell array 110 of the semiconductor memory device 100 may be configured as a memory cell array of a three-dimensional structure. In addition, as shown in FIG. 5, the memory cell array 110 of the semiconductor memory device 100 may be configured as a memory cell array of a two-dimensional structure.

Figure 6:
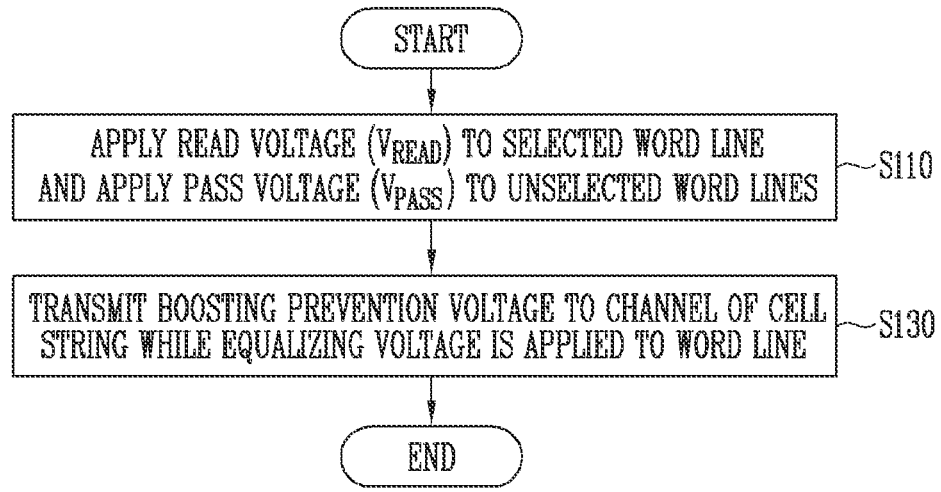
FIG. 6 is a flowchart illustrating a method of operating a semiconductor memory device according to an embodiment of the present disclosure.

FIG. 6 is a flowchart illustrating a method of operating a semiconductor memory device according to an embodiment of the present disclosure.

Referring to FIG. 6, the method of operating the semiconductor memory device according to an embodiment of the present disclosure may include applying the read voltage $V_{READ}$ to the selected word line and applying the pass voltage $V_{PASS}$ to the unselected word lines (S110) and transmitting a boosting prevention voltage to a channel of the cell string while applying an equalizing voltage to the word line (S130).

In step S110, the read voltage $V_{READ}$ may be applied to the selected word line that is connected to the memory cells that are selected as a target of the read operation, and the pass voltage $V_{PASS}$ may be applied to the remaining unselected word lines. Accordingly, data that is stored in the memory cells that are selected as the target of the read operation may be read. After the read data is temporarily stored in the page buffers PB1 to PBm, the read data may be output through the input/output buffer (not shown) of the semiconductor memory device 100. An operation of the semiconductor memory device 100 performed in step S110 is described in more detail with reference to FIG. 8.

In step S130, the read voltage $V_{READ}$ that is applied to the selected word line and the pass voltage $V_{PASS}$ that is applied to the unselected word lines in step S110 may be discharged. To this end, in step S130, an equalizing voltage $V_{EQ}$ may be applied to the selected word line and the unselected word lines. Meanwhile, in step S130, while the equalizing voltage $V_{EQ}$ is applied to the word lines, a boosting prevention voltage for preventing the boosting of the channel voltage of the cell string may be transmitted to the channel. As described above, as the read voltage $V_{READ}$ that is applied to the word lines and the pass voltage $V_{PASS}$ that is applied to the unselected word lines are discharged, a negative boosting phenomenon of the channel voltage in the cell string may occur. In addition, while recovering the negative boosting of the channel voltage, the positive boosting may occur toward the word line. Accordingly, the threshold voltage distribution of the memory cells may move in a positive direction, and thus, the read disturb may occur during the subsequent read operation.

In accordance with the semiconductor memory device and the method of operating the same according to an embodiment of the present disclosure, the negative boosting of the channel voltage of the cell string may be minimized by transmitting the boosting prevention voltage to the channel of the cell string in step S130. Therefore, the positive boosting that occurs in the word line in the recovery step may be minimized. As a result, the movement width of the threshold voltage distribution of the memory cells may be minimized, and thus, the influence of the read disturb may be reduced.

Exemplary embodiments of step S130 of FIG. 6 are described later with reference to FIGS. 7, 10 and 12.

Figure 7:
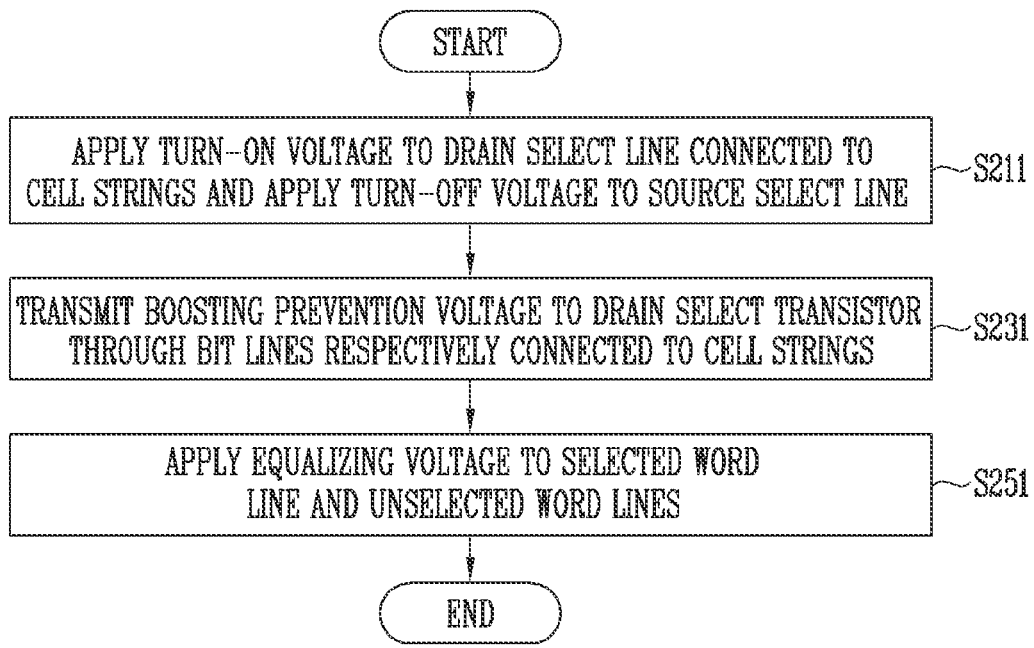
FIG. 7 is a flowchart illustrating an embodiment of step S130 of FIG. 6.

FIG. 7 is a flowchart illustrating an embodiment of step S130 of FIG. 6.

Referring to FIG. 7, step S130 of FIG. 6 may include applying a turn-on voltage $V_{ON}$ to the drain select line DSL that is connected to the cell strings and applying a turn-off voltage $V_{OFF}$ to the source select line SSL (S211), transmitting the boosting prevention voltage to the drain select transistor DST through the bit lines BL1 to BLm that are respectively connected to the cell strings (S231), and applying the equalizing voltage $V_{EQ}$ to the selected word line and the unselected word lines (S251).

In step S211, as the turn-on voltage $V_{ON}$ is applied to the drain select line DSL and the turn-off voltage $V_{OFF}$ is applied to the source select line SSL, the drain select transistor DST of the cell string may be turned on and the source select transistor SST may be turned off. Thereafter, in step S231, the boosting prevention voltage may be transmitted to the drain select transistor DST through the bit lines. Since the drain select transistor DST is turned on, the boosting prevention voltage may be transmitted to the channel region in the cell string.

Thereafter, in step S251, the equalizing voltage $V_{EQ}$ may be applied to the word lines. The equalizing voltage $V_{EQ}$ may be a voltage greater than the read voltage $V_{READ}$. Meanwhile, since the boosting prevention voltage is transmitted to the channel region in the cell string through step S231, even though the equalizing voltage $V_{EQ}$ is applied to the word lines WL1 to WLn, and thereafter, the equalizing voltage $V_{EQ}$ of the word lines WL1 to WLn may be discharged, a phenomenon in which the channel voltage of the cell string is negatively boosted may be minimized. To this end, the operation of transmitting the boosting prevention voltage to the drain select transistor through the bit lines in step S231 may be maintained until the equalizing voltage $V_{EQ}$ of the word lines is discharged. In addition, the operation of applying the turn-on voltage to the drain select line DSL in step S211 may also be maintained until the equalizing voltage $V_{EQ}$ of the word lines is discharged.

Figure 8:
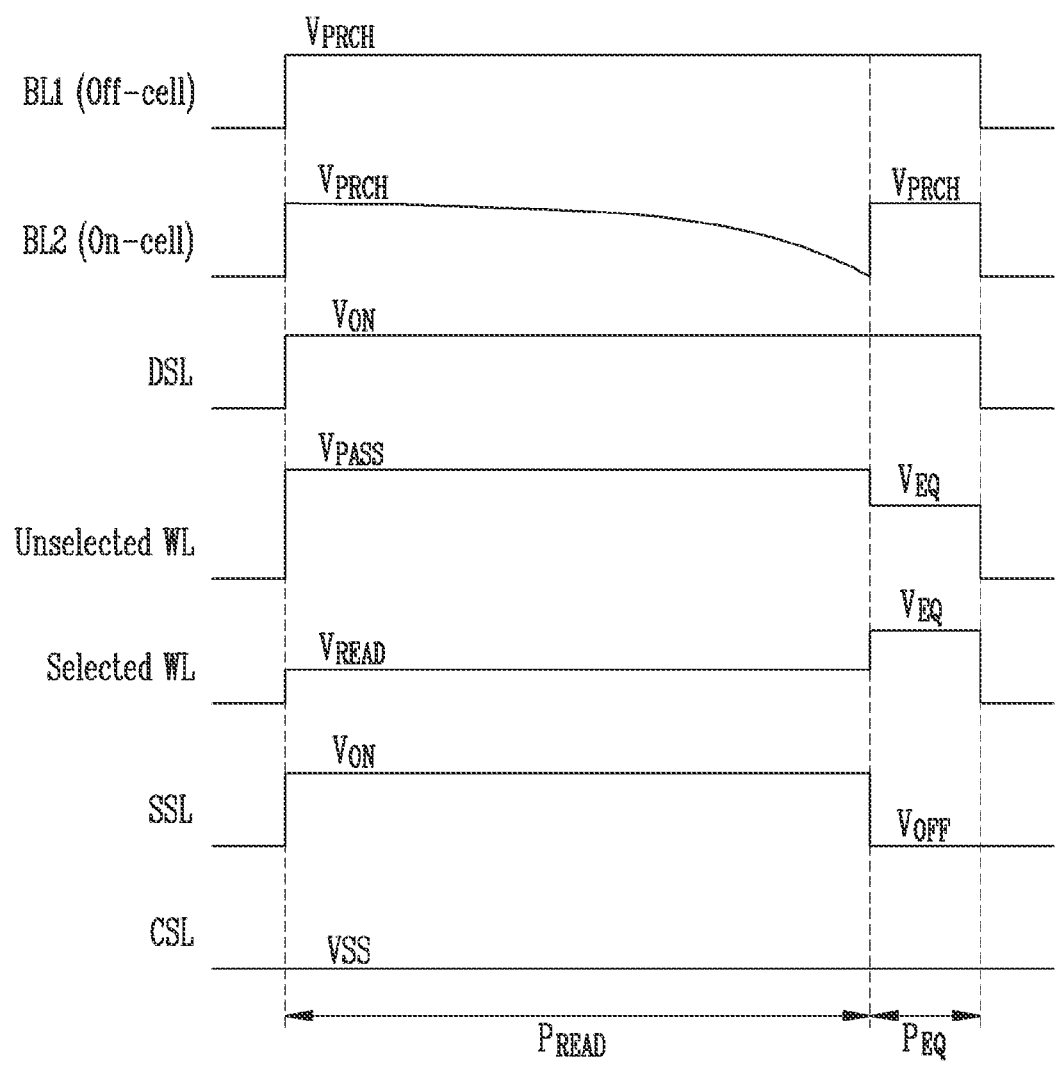
FIG. 8 is a timing diagram illustrating the method of operating the semiconductor memory device according to FIG. 7.

FIG. 8 is a timing diagram illustrating the method of operating the semiconductor memory device according to FIG. 7.

Referring to FIG. 8, a timing diagram that is related to voltages of the bit lines BL1 and BL2, the drain select line DSL, the unselected word line Unselected WL, the selected word line Selected WL, the source select line SSL, and the common source line CSL during a read period $P_{READ}$ and an equalizing period $P_{EQ}$ is shown. In FIG. 8, an example in which an off-cell among the memory cells that are selected as a read target is connected to the first bit line BL1 and an on-cell is connected to the second bit line BL2 is shown.

In the read period $P_{READ}$, the bit lines BL1 and BL2 may be precharged. Accordingly, the voltage of the bit lines BL1 and BL2 may increase to a precharge voltage $V_{PRCH}$. Meanwhile, the turn-on voltage $V_{ON}$ may be applied to the drain select line DSL and the source select line SSL in the read period $P_{READ}$. A ground voltage VSS may be applied to the common source line CSL.

Among the word lines, the pass voltage $V_{PASS}$ may be applied to the unselected word line, and the read voltage $V_{READ}$ may be applied to the selected word line (S110). The read voltage $V_{READ}$ may be less than the pass voltage $V_{PASS}$. Through this, the data that is stored in the memory cells that are connected to the selected word line may be read.

For example, since the cell string that is connected to the bit line BL1 may include the off cell, the precharge voltage $V_{PRCH}$ that is applied at the beginning of the read period $P_{READ}$ may be maintained. Meanwhile, since the cell string that is connected to the bit line BL2 includes the on cell, the precharge voltage $V_{PRCH}$ that is applied at the beginning of the read period $P_{READ}$ may be decreased. As described above, the data that is stored in a connected memory cell may be distinguished according to whether the precharge voltage $V_{PRCH}$ is decreased.

After the read period $P_{READ}$ is ended, the turn-on voltage $V_{ON}$ may be applied to the drain select line DSL, and the turn-off voltage $V_{OFF}$ may be applied to the source select line SSL in the equalizing period $P_{EQ}$ (S211). In addition, the boosting prevention voltage may be applied to the bit lines BL1 and BL2 in the equalizing period $P_{EQ}$ (S231). In the embodiment of FIG. 8, the precharge voltage $V_{PRCH}$ may be used as the boosting prevention voltage.

Meanwhile, the equalizing voltage $V_{EQ}$ may be applied to the unselected word line and the selected word line in the equalizing period $P_{EQ}$ (S251). In an embodiment, as shown in FIG. 8, the equalizing voltage $V_{EQ}$ may be a voltage that is greater than the read voltage $V_{READ}$ and less than the pass voltage $V_{PASS}$. In another embodiment, the equalizing voltage $V_{EQ}$ may be a voltage of the same magnitude as the pass voltage $V_{PASS}$.

As shown in FIG. 8, as the turn-on voltage $V_{ON}$ is applied to the drain select line DSL and the turn-off voltage $V_{OFF}$ to the source select line SSL during the equalizing period $P_{EQ}$, the drain select transistor DST may be turned on and the source select transistor SST may be turned off. In addition, as the boosting prevention voltage is applied to the bit lines BL1 and BL2 during the equalizing period $P_{EQ}$ (S231), the boosting prevention voltage may be transmitted to the channel region of the cell string through the drain select transistor DST. Since the boosting prevention voltage is transmitted to the channel region in the cell string, even though the equalizing voltage $V_{EQ}$ is applied to the word lines WL1 to WLn (S251), and thereafter, the equalizing voltage $V_{EQ}$ of the word lines is discharged, the phenomenon in which the channel voltage of the cell string is negatively boosted may be minimized. Therefore, the positive boosting that occurs in the word line in the recovery step may be minimized. As a result, the movement width of the threshold voltage distribution of the memory cells may be minimized, and thus, the influence of the read disturb may be reduced.

Figure 9:
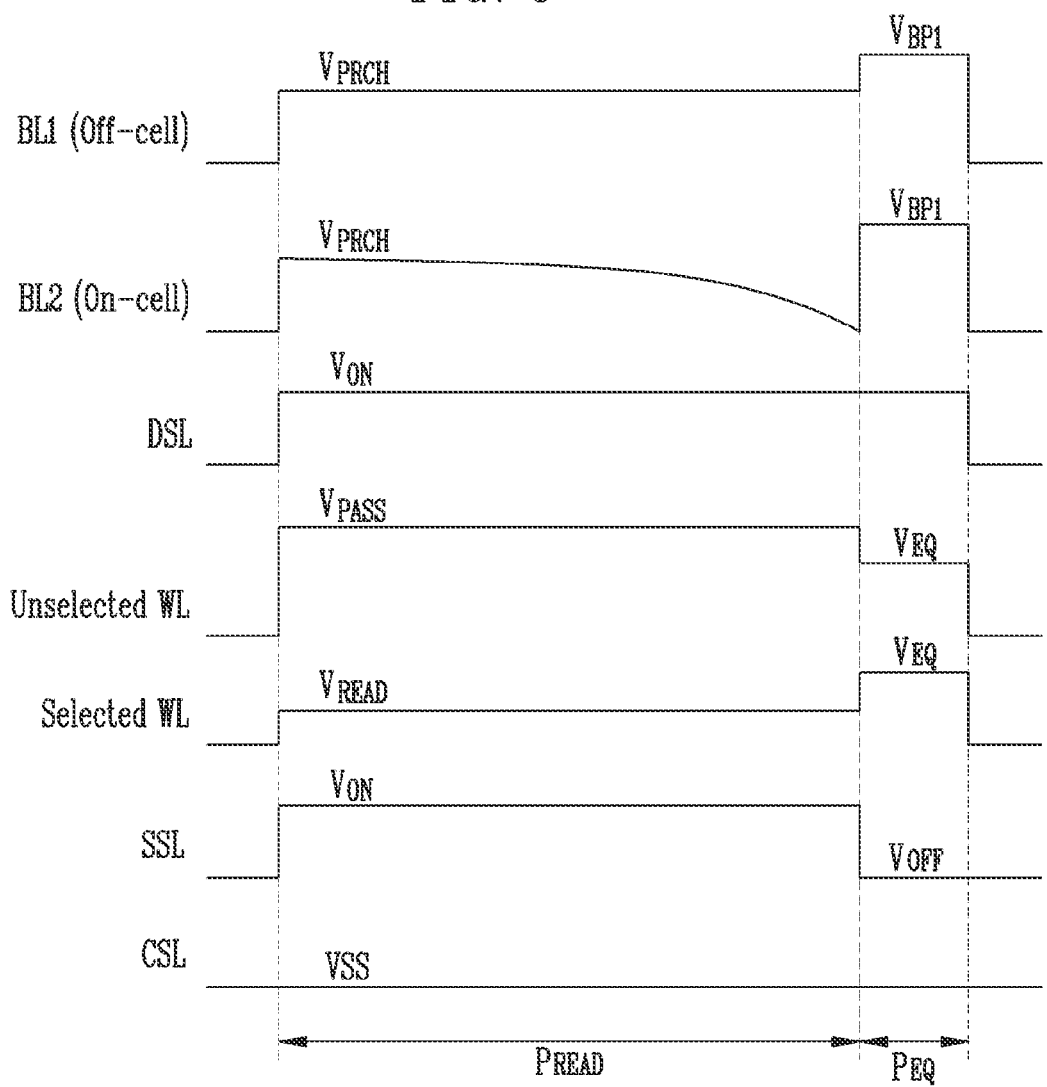
FIG. 9 is another timing diagram illustrating the method of operating the semiconductor memory device according to FIG. 7.

FIG. 9 is another timing diagram illustrating the method of operating the semiconductor memory device according to FIG. 7. Similarly to FIG. 8, in FIG. 9, a timing diagram related to the voltages of the bit lines BL1 and BL2, the drain select line DSL, the unselected word line Unselected WL, the selected word line Selected WL, the source select line SSL, and the common source line CSL during the read period $P_{READ}$ and the equalizing period $P_{EQ}$ is shown. Hereinafter, a description repetitive to that of FIG. 8 is omitted.

Referring to FIG. 9, an operation in the read period $P_{READ}$ is the same as that described with reference to FIG. 8. Meanwhile, an operation in the equalizing period $P_{EQ}$ is the same as that described with reference to FIG. 8, except for the magnitude of the voltage that is applied to the bit line.

That is, according to the embodiment of FIG. 9, a boosting prevention voltage $V_{BP1}$ that is greater than the precharge voltage $V_{PRCH}$ may be applied to the bit lines BL1 and BL2 in the equalizing period $P_{EQ}$. As the magnitude of the boosting prevention voltage $V_{BP1}$ increases, a phenomenon in which the channel region of the cell strings is negatively boosted may be further reduced. FIG. 8 shows an embodiment in which the precharge voltage $V_{PRCH}$ is used as the boosting prevention voltage, and FIG. 9 shows an embodiment in which the boosting prevention voltage $V_{BP1}$ that is greater than the precharge voltage $V_{PRCH}$ is used, but the present disclosure is not limited thereto. That is, a boosting prevention voltage that is less than the precharge voltage $V_{PRCH}$ may also be used.

Figure 10:
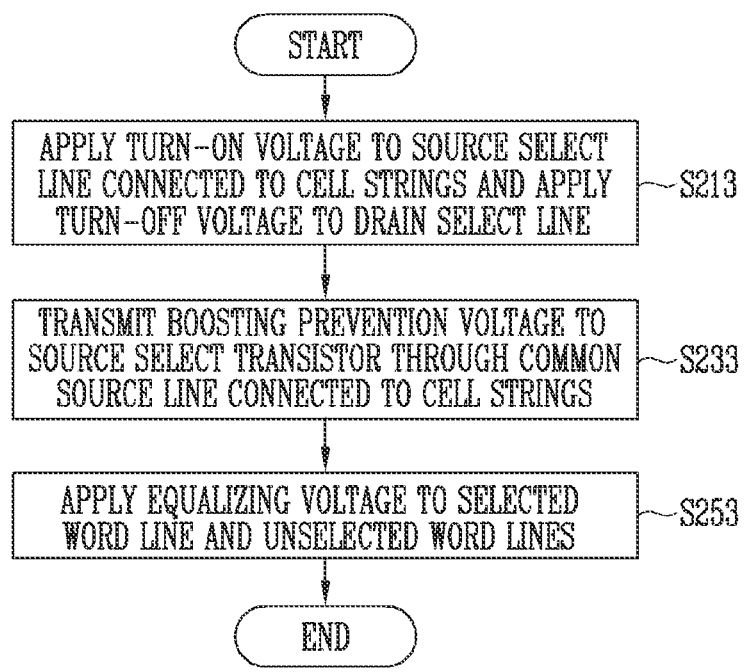
FIG. 10 is a flowchart illustrating another embodiment of step S130 of FIG. 6.

FIG. 10 is a flowchart illustrating another embodiment of step S130 of FIG. 6.

Referring to FIG. 10, step S130 of FIG. 6 may include applying the turn-on voltage $V_{ON}$ to the source select line SSL that is connected to the cell strings and applying the turn-off voltage $V_{OFF}$ to the drain select line DSL (S213), transmitting the boosting prevention voltage to the source select transistor SST through the common source line CSL that is connected to the cell strings (S233), and applying the equalizing voltage $V_{EQ}$ to the selected word line and the unselected word lines (S253).

In step S213, as the turn-on voltage $V_{ON}$ is applied to the source select line SSL and the turn-off voltage $V_{OFF}$ is applied to the drain select line DSL, the source select transistor SST of the cell string may be turned on, and the drain select transistor DST may be turned off. Thereafter, in step S233, the boosting prevention voltage may be transmitted to the source select transistor SST through the source select line CSL. Since the source select transistor SST is turned on, the boosting prevention voltage may be transmitted to the channel region in the cell string.

Thereafter, in step S253, the equalizing voltage $V_{EQ}$ may be applied to the word lines. The equalizing voltage $V_{EQ}$ may be a voltage that is greater than the read voltage $V_{READ}$. Meanwhile, since the boosting prevention voltage is transmitted to the channel region in the cell string through step S233, even though the equalizing voltage $V_{EQ}$ is applied to the word lines WL1 to WLn, and thereafter, the equalizing voltage $V_{EQ}$ of the word lines WL1 to WLn is discharged, the phenomenon in which the channel voltage of the cell string is negatively boosted may be minimized. To this end, the operation of transmitting the boosting prevention voltage to the source select transistor SST through the common source line CSL in step S233 may be maintained until the equalizing voltage $V_{EQ}$ of the word lines is discharged. In addition, the operation of applying the turn-on voltage to the source select line SSL in step S213 may also be maintained until the equalizing voltage $V_{EQ}$ of the word lines is discharged.

Figure 11:
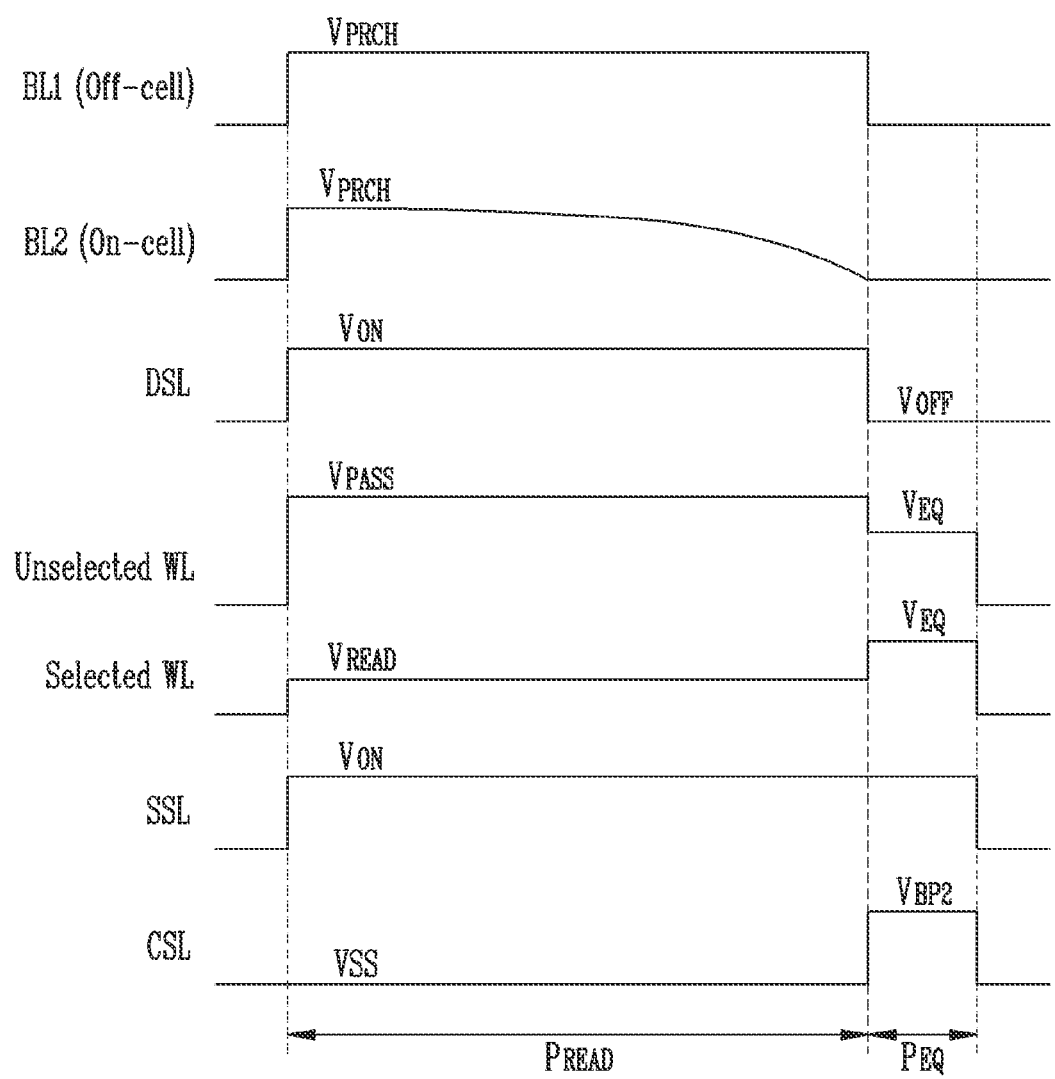
FIG. 11 is a timing diagram illustrating the method of operating the semiconductor memory device according to FIG. 10.

FIG. 11 is a timing diagram illustrating the method of operating the semiconductor memory device according to FIG. 10. Similarly to FIGS. 8 and 9, in FIG. 11, a timing diagram related to the voltages of the bit lines BL1 and BL2, the drain select line DSL, the unselected word line Unselected WL, the selected word line Selected WL, the source select line SSL, and the common source line CSL during a read period $P_{READ}$ and an equalizing period $P_{EQ}$ is shown. Hereinafter, a description repetitive to that of FIG. 8 or 9 is omitted.

Referring to FIG. 11, the operation in the read period $P_{READ}$ is the same as that described with reference to FIGS. 8 and 9. Meanwhile, the operation in the equalizing period $P_{EQ}$ is described below.

After the read period $P_{READ}$ is ended, the turn-on voltage $V_{ON}$ may be applied to the source select line SSL, and the turn-off voltage $V_{OFF}$ may be applied to the drain select line DSL in the equalizing period $P_{EQ}$ (S213). In addition, a boosting prevention voltage $V_{BP2}$ may be applied to the common source line CSL in the equalizing period $P_{EQ}$ (S233).

Meanwhile, the equalizing voltage $V_{EQ}$ may be applied to the unselected word line and the selected word line in the equalizing period $P_{EQ}$ (S253). In an embodiment, as shown in FIG. 11, the equalizing voltage $V_{EQ}$ may be a voltage that is greater than the read voltage $V_{READ}$ and less than the pass voltage $V_{PASS}$. In another embodiment, the equalizing voltage $V_{EQ}$ may be a voltage of the same magnitude as the pass voltage $V_{PASS}$.

As shown in FIG. 11, the source select transistor SST may be turned on and the drain select transistor DST may be turned off, by applying the turn-on voltage $V_{ON}$ to the source select line SSL and applying the turn-off voltage $V_{OFF}$ to the drain select line DSL during the equalizing period $P_{EQ}$ (S213). In addition, as the boosting prevention voltage $V_{BP2}$ is applied to the common source line CSL during the equalizing period $P_{EQ}$ (S233), the boosting prevention voltage may be transmitted to the channel region of the cell string through the source select transistor SST. Since the boosting prevention voltage is transmitted to the channel region in the cell string, even though the equalizing voltage $V_{EQ}$ is applied to the word lines WL1 to WLn (S253), and thereafter, the equalizing voltage $V_{EQ}$ of the word lines is discharged, the phenomenon in which the channel voltage of the cell string is negatively boosted may be minimized. Therefore, the positive boosting that occurs in the word line in the recovery step may be minimized. As a result, the movement width of the threshold voltage distribution of the memory cells may be minimized, and thus the influence of the read disturb may be reduced.

According to the embodiment described with reference to FIGS. 7 to 9, the boosting prevention voltage is transmitted from the bit lines to the channel region in the cell string through the drain select transistor. On the other hand, according to the embodiment described with reference to FIGS. 10 and 11, the boosting prevention voltage is transmitted from the common source line to the channel region in the cell string through the source select transistor.

Figure 12:
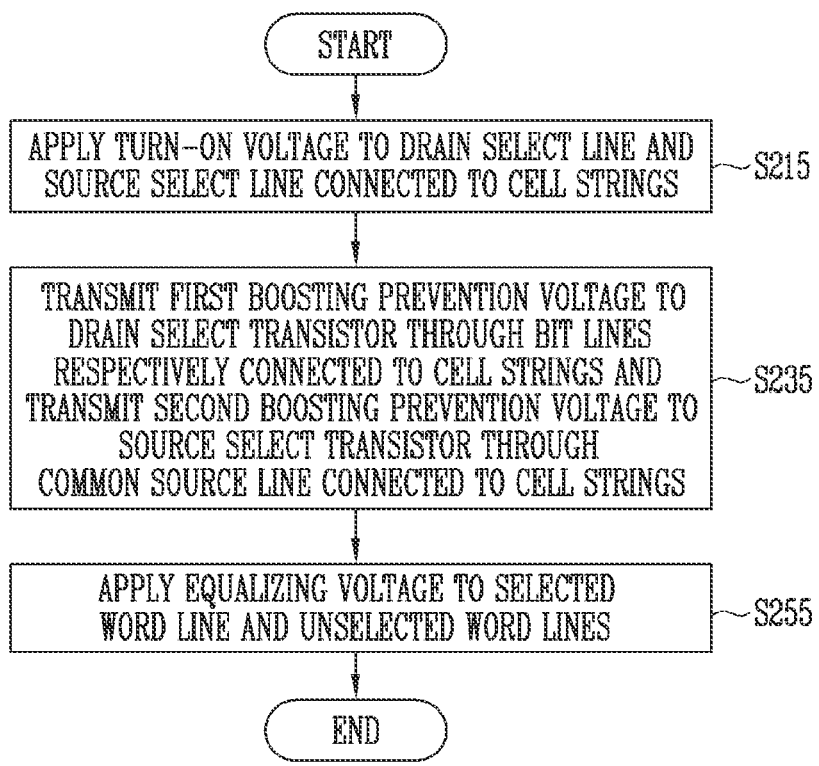
FIG. 12 is a flowchart illustrating still another embodiment of step S130 of FIG. 6.

FIG. 12 is a flowchart illustrating still another embodiment of step S130 of FIG. 6.

Referring to FIG. 12, step S130 of FIG. 6 may include applying a turn-on voltage $V_{ON}$ to the drain select line DSL and the source select line SSL that is connected to the cell strings (S215), transmitting the first boosting prevention voltage to the drain select transistor DST through the bit lines BL1 to BLm respectively connected to the cell strings and transmitting the second boosting prevention voltage to the source select transistor SST through the common source line CSL connected to the cell strings (S235), and applying the equalizing voltage $V_{EQ}$ to the selected word line and the unselected word lines (S255).

In step S215, as the turn-on voltage $V_{ON}$ is applied to the drain select line DSL and the source select line SSL, the drain select transistor DST and the source select transistor SST of the cell string may be turned on. Thereafter, in step S235, the first boosting prevention voltage may be transmitted to the drain select transistor DST through the bit lines, and the second boosting prevention voltage may be transmitted to the source select transistor SST through the common source line CSL. Since the drain select transistor DST is turned on, the first boosting prevention voltage may be transmitted to the channel region in the cell string. Meanwhile, since the source select transistor SST is turned on, the second boosting prevention voltage may also be transmitted to the channel region in the cell string. In an embodiment, the first boosting prevention voltage may have the same magnitude as the second boosting prevention voltage. In another embodiment, the first boosting prevention voltage and the second boosting prevention voltage may have different magnitudes.

Thereafter, in step S255, the equalizing voltage $V_{EQ}$ may be applied to the word lines. Since the first and second boosting prevention voltages are transmitted to the channel region in the cell string through step S235, even though the equalizing voltage $V_{EQ}$ is applied to the word lines WL1 to WLn, and thereafter, the equalizing voltage $V_{EQ}$ of the word lines WL1 to WLn is discharged, the phenomenon in which the channel voltage of the cell string is negatively boosted may be minimized. To this end, in step S235, the operation of transmitting the first boosting prevention voltage to the drain select transistor through the bit lines and the operation of transmitting the second boosting prevention voltage to the source select transistor SST through the common source line CSL may be maintained until the equalizing voltage $V_{EQ}$ of the word lines is discharged. In addition, the operation of applying the turn-on voltage to the drain select line DSL and the source select line SSL in step S215 may also be maintained until the equalizing voltage $V_{EQ}$ of the word lines is discharged.

Figure 13:
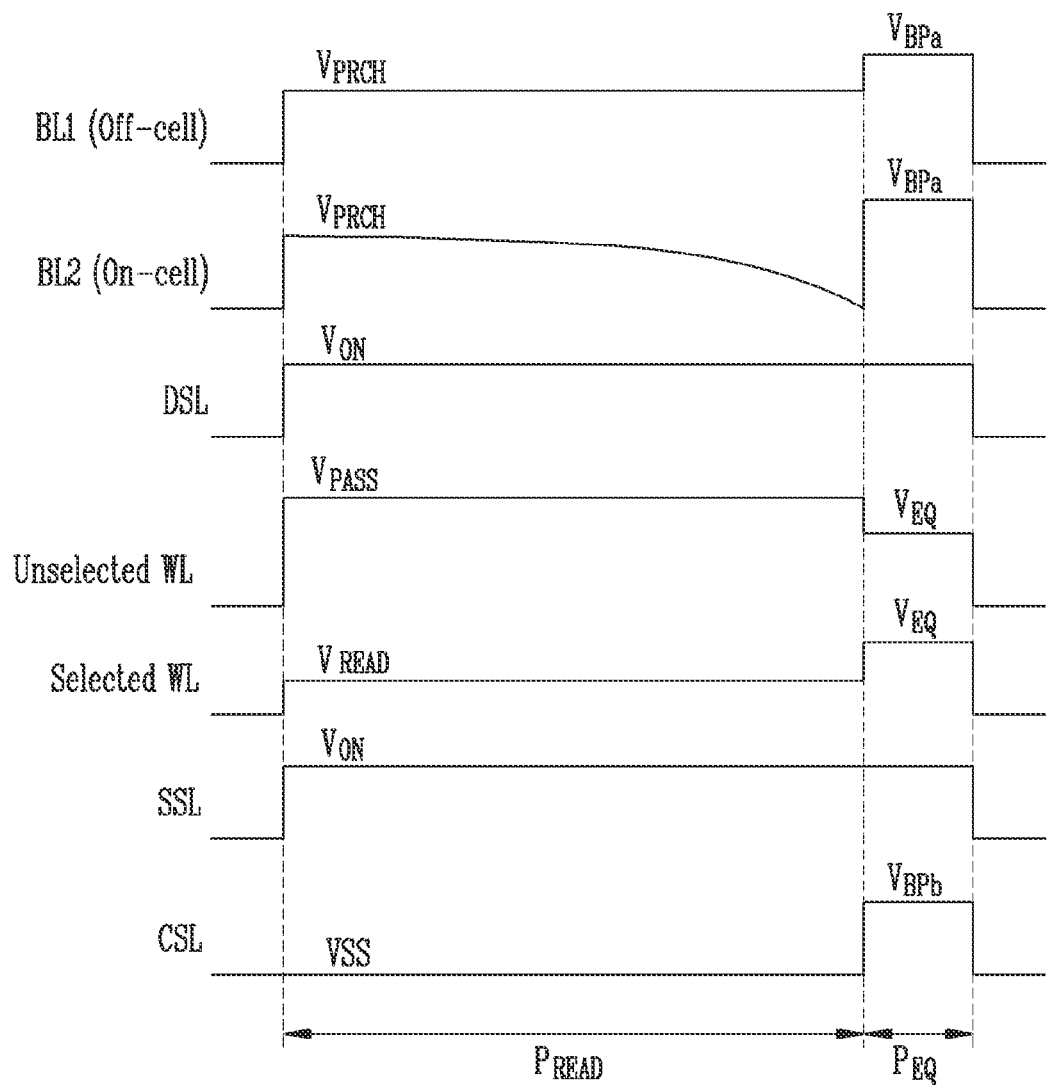
FIG. 13 is a timing diagram illustrating the method of operating the semiconductor memory device according to FIG. 12.

FIG. 13 is a timing diagram illustrating the method of operating the semiconductor memory device according to FIG. 12.

Similarly to FIGS. 8, 9, and 11, in FIG. 13, a timing diagram related to the voltages of the bit lines BL1 and BL2, the drain select line DSL, the unselected word line Unselected WL, the selected word line Selected WL, the source select line SSL, and the common source line CSL during a read period $P_{READ}$ and an equalizing period $P_{EQ}$ is shown. Hereinafter, a description repetitive to that of FIG. 8, 9, or 11 is omitted.

Referring to FIG. 13, the operation in the read period $P_{READ}$ is the same as that described with reference to FIGS. 8, 9, and 11. Meanwhile, the operation in the equalizing period $P_{EQ}$ is described below.

After the read period $P_{READ}$ is ended, the turn-on voltage $V_{ON}$ may be applied to the drain select line DSL and the source select line SSL in the equalizing period $P_{EQ}$ (S215). In addition, in the equalizing period $P_{EQ}$, the first boosting prevention voltage VBPa may be applied to the bit lines BL1 and BL2, and the second boosting prevention voltage VBPb may be applied to the common source line CSL (S235).

Meanwhile, the equalizing voltage $V_{EQ}$ may be applied to the unselected word line and the selected word line in the equalizing period $P_{EQ}$ (S255). In an embodiment, as shown in FIG. 13, the equalizing voltage $V_{EQ}$ may be a voltage that is greater than the read voltage $V_{READ}$ and less than the pass voltage $V_{PASS}$. In another embodiment, the equalizing voltage $V_{EQ}$ may be a voltage of the same magnitude as the pass voltage $V_{PASS}$.

As shown in FIG. 13, the drain select transistor DST and the source select transistor SST may be turned on by applying the turn-on voltage $V_{ON}$ to the drain select line DSL and the source select line SSL during the equalizing period $P_{EQ}$ (S215). In addition, as the first boosting prevention voltage $V_{BPa}$ is applied to the bit lines BL1 and BL2 during the equalizing period $P_{EQ}$ (S235), the first boosting prevention voltage $V_{BPa}$ may be transmitted to the channel region of the cell string through the drain select transistor DST. Meanwhile, as the second boosting prevention voltage $V_{BPb}$ is applied to the common source line CSL during the equalizing period $P_{EQ}$ (S235), the second boosting prevention voltage $V_{BPb}$ may be transmitted to the channel region of the cell string through the source select transistor SST. Since the first and second boosting prevention voltages $V_{BPa}$ and $V_{BPb}$ are transmitted to the channel region in the cell string, even though the equalizing voltage $V_{EQ}$ is applied to the word lines WL1 to WLn (S255), and thereafter, the equalizing voltage $V_{EQ}$ of the word lines is discharged, the phenomenon in which the channel voltage of the cell string is negatively boosted may be minimized. Therefore, the positive boosting that may occur in the word line in the recovery step may be minimized. As a result, the movement width of the threshold voltage distribution of the memory cells may be minimized, and thus, the influence of the read disturb may be reduced.

According to the embodiment described with reference to FIGS. 7 to 9, the boosting prevention voltage may be transmitted from the bit lines to the channel region in the cell string through the drain select transistor. On the other hand, according to the embodiment described with reference to FIGS. 10 and 11, the boosting prevention voltage may be transmitted from the common source line to the channel region in the cell string through the source select transistor. According to the embodiment described with reference to FIGS. 12 and 13, the first and second boosting prevention voltages may be transmitted from both sides of the bit lines and the common source line to the channel region in the cell string through the drain select transistor and the source select transistor, respectively.

Figure 14:
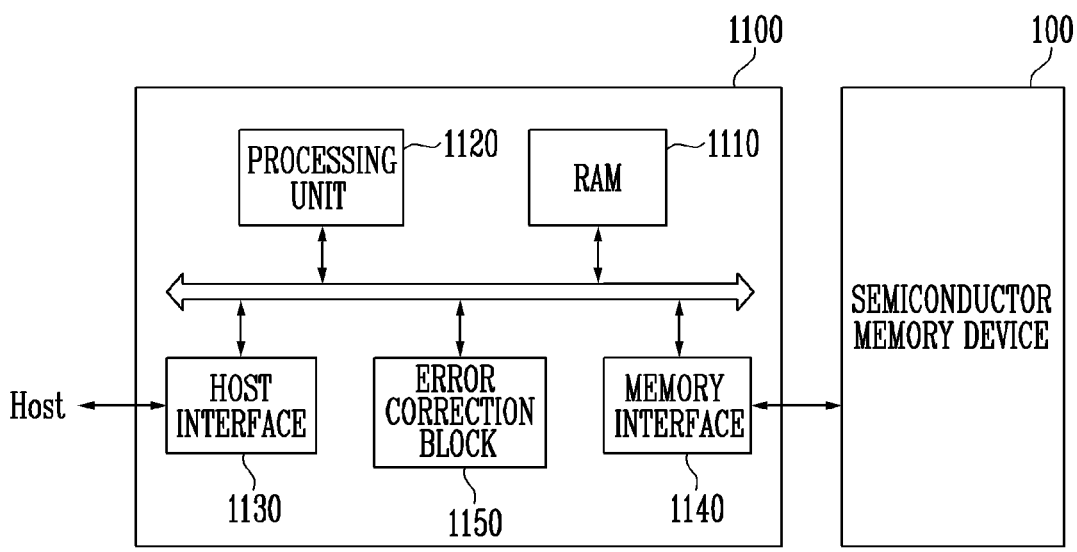
FIG. 14 is a block diagram illustrating a memory system 1000 including the semiconductor memory device 100 of FIG. 1.

FIG. 14 is a block diagram illustrating a memory system 1000 including the semiconductor memory device 100 of FIG. 1.

Referring to FIG. 14, the memory system 1000 may include the semiconductor memory device 100 and a memory controller 1100. The semiconductor memory device 100 may be the semiconductor memory device described with reference to FIG. 1. Hereinafter, a repetitive description is omitted.

The memory controller 1100 may be connected to a host Host and the semiconductor memory device 100. The memory controller 1100 may be configured to access the semiconductor memory device 100 in response to a request from the host Host. For example, the memory controller 1100 may be configured to control read, write, erase, and background operations of the semiconductor memory device 100. The memory controller 1100 may be configured to provide an interface between the semiconductor memory device 100 and the host Host. The memory controller 1100 may be configured to drive firmware for controlling the semiconductor memory device 100.

The memory controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 may control an overall operation of the memory controller 1100. In addition, the memory controller 1100 may temporarily store program data provided from the host Host during the write operation.

The host interface 1130 may include a protocol for performing data exchange between the host Host and the memory controller 1100. As an exemplary embodiment, the memory controller 1100 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 may be configured to detect and correct an error of data received from the semiconductor memory device 100 using an error correcting code (ECC). As an exemplary embodiment, the error correction block may be provided as a component of the memory controller 1100.

The memory controller 1100 and the semiconductor memory device 100 may be integrated into one semiconductor device. As an exemplary embodiment, the memory controller 1100 and the semiconductor memory device 100 may be integrated into one semiconductor device to form a memory card. For example, the memory controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The memory controller 1100 and the semiconductor memory device 100 may be integrated into one semiconductor device to form a semiconductor drive (solid state drive (SSD)). The semiconductor drive (SSD) may include a storage device configured to store data in a semiconductor memory. When the memory system 1000 is used as the semiconductor drive (SSD), an operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 15:
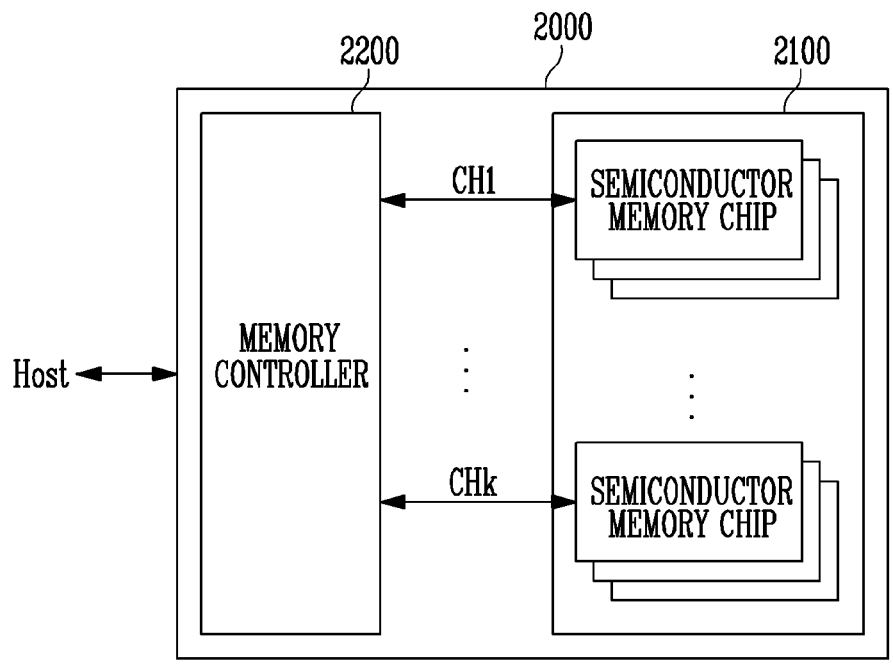
FIG. 15 is a block diagram illustrating an application example of the memory system of FIG. 14.

FIG. 15 is a block diagram illustrating an application example of the memory system of FIG. 14.

Referring to FIG. 15, the memory system 2000 may include a semiconductor memory device 2100 and a memory controller 2200. The semiconductor memory device 2100 may include a plurality of semiconductor memory chips. The plurality of semiconductor memory chips are divided into a plurality of groups.

In FIG. 15, the plurality of groups may communicate with the memory controller 2200 through first to k-th channels CH1 to CHk, respectively. Each semiconductor memory chip may be configured and is operated similarly to the semiconductor memory device 100 described with reference to FIG. 1.

Each group may be configured to communicate with the memory controller 2200 through one common channel. The memory controller 2200 may be configured similarly to the memory controller 1100 described with reference to FIG. 14 and may be configured to control the plurality of memory chips of the semiconductor memory device 2100 through the plurality of channels CH1 to CHk.

Figure 16:
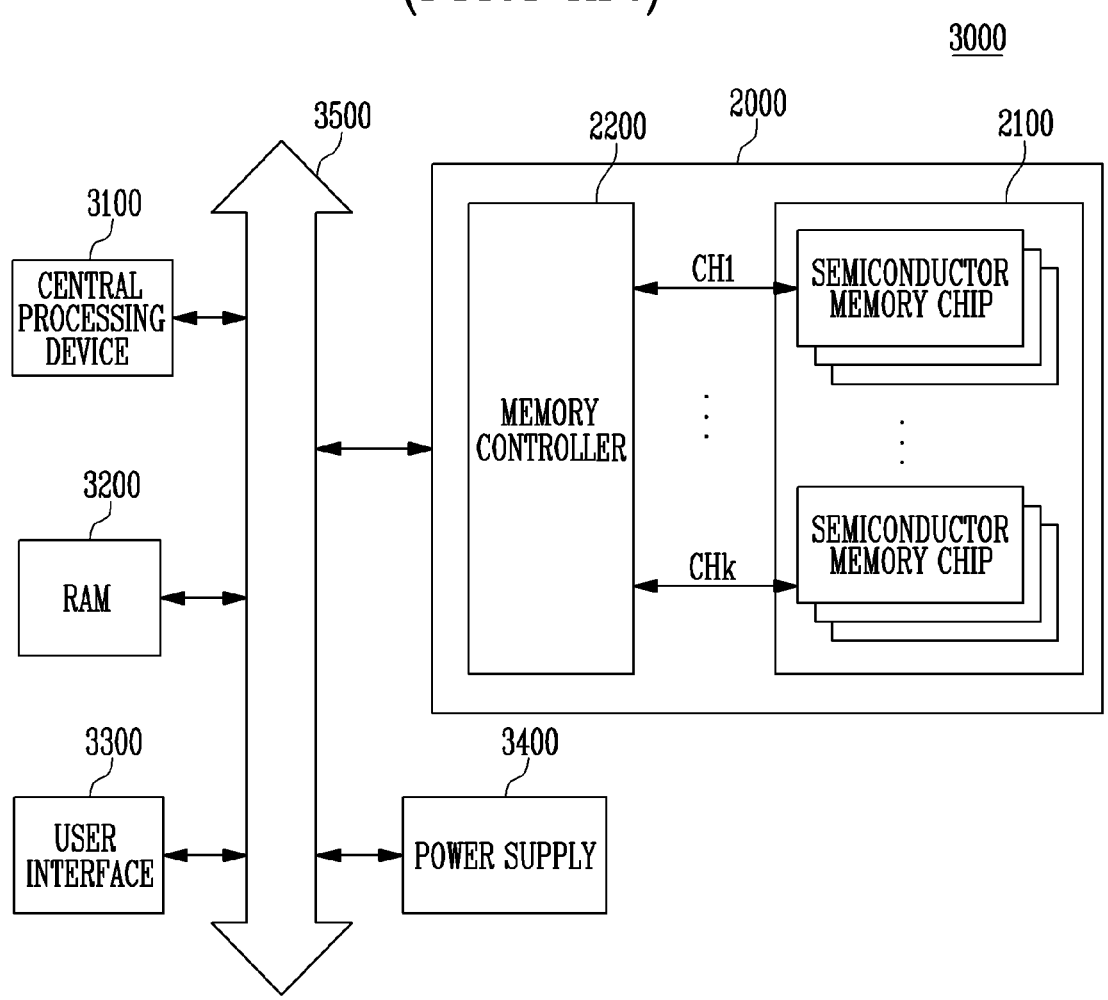
FIG. 16 is a block diagram illustrating a computing system including the memory system described with reference to FIG. 15.

FIG. 16 is a block diagram illustrating a computing system including the memory system described with reference to FIG. 15.

The computing system 3000 may include a central processing device 3100, a random access memory (RAM) 3200, a user interface 3300, a power supply 3400, a system bus 3500, and the memory system 2000.

The memory system 2000 may be electrically connected to the central processing device 3100, the RAM 3200, the user interface 3300, and the power supply 3400 through the system bus 3500. Data provided through the user interface 3300 or processed by the central processing device 3100 may be stored in the memory system 2000.

In FIG. 16, the semiconductor memory device 2100 may be connected to the system bus 3500 through the memory controller 2200. However, the semiconductor memory device 2100 may be configured to be directly connected to the system bus 3500. At this time, a function of the memory controller 2200 may be performed by the central processing device 3100 and the RAM 3200.

In FIG. 16, the memory system 2000 described with reference to FIG. 15 is provided. However, the memory system 2000 may be replaced with the memory system 1000 described with reference to FIG. 14. As an exemplary embodiment, the computing system 3000 may be configured to include both of the memory systems 1000 and 2000 described with reference to FIGS. 14 and 15.

What is claimed is:

1. A semiconductor memory device comprising:
   a cell string including at least one drain select transistor that is connected to a bit line, at least one source select transistor that is connected to a common source line, and a plurality of memory cells that are connected between the drain select transistor and the source select transistor; and
   a peripheral circuit configured to perform a read operation on a selected memory cell among the plurality of memory cells,
   wherein the peripheral circuit is configured to:
   read data that is stored in the selected memory cell by applying a read voltage to a selected word line among word lines that are connected to the plurality of memory cells and by applying a pass voltage to unselected word lines
   apply a turn-on voltage to a drain select line that is connected to the drain select transistor;
   apply a turn-off voltage to a source select line that is connected to the source select transistor while applying the turn-on voltage to the drain select line; and
   apply a boosting prevention voltage to the bit line while applying an equalizing voltage to the word lines.

2. The semiconductor memory device of claim 1, wherein the boosting prevention voltage is the same voltage as a precharge voltage that is applied to the bit line at a beginning of the read operation.

3. The semiconductor memory device of claim 1, wherein the boosting prevention voltage is a voltage greater than a precharge voltage that is applied to the bit line at a beginning of the read operation.

4. The semiconductor memory device of claim 1, wherein the equalizing voltage is greater than the read voltage and less than the pass voltage.

5. The semiconductor memory device of claim 1, wherein the equalizing voltage is the same voltage as the pass voltage.

6. A semiconductor memory device comprising:
   a cell string including at least one drain select transistor that is connected to a bit line, at least one source select transistor that is connected to a common source line, and a plurality of memory cells that are connected between the drain select transistor and the source select transistor; and
   a peripheral circuit configured to perform a read operation on a selected memory cell among the plurality of memory cells,
   wherein the peripheral circuit is configured to:
   read data that is stored in the selected memory cell by applying a read voltage to a selected word line among word lines that are connected to the plurality of memory cells and by applying a pass voltage to unselected word lines;
   apply a turn-on voltage to a source select line that is connected to the source select transistor;
   apply a turn-off voltage to a drain select line that is connected to the drain select transistor while applying the turn-on voltage to the source select line; and
   apply the boosting prevention voltage to the common source line while applying the equalizing voltage to the word lines.

7. A method of operating a semiconductor memory device comprising a cell string including at least one drain select transistor that is connected to a bit line, at least one source select transistor that is connected to a common source line, and a plurality of memory cells that are connected between the drain select transistor and the source select transistor, the method comprising:
- applying a read voltage to a selected word line among a plurality of word lines that are respectively connected to the plurality of memory cells and applying a pass voltage to unselected word lines;
- applying a turn-on voltage to a drain select line that is connected to the drain select transistor;
- applying a turn-off voltage to a source select line that is connected to the source select transistor;
- transmitting a boosting prevention voltage to the drain select transistor through the bit line; and
- applying an equalizing voltage to the plurality of word lines.

8. The method of claim 7, further comprising, before applying the read voltage to the selected word line among the plurality of word lines that are respectively connected to the plurality of memory cells and applying the pass voltage to the unselected word lines:
- applying a precharge voltage to the bit line,
- wherein the boosting prevention voltage is the same voltage as the precharge voltage.

9. The method of claim 7, further comprising, before applying the read voltage to the selected word line among the plurality of word lines that are respectively connected to the plurality of memory cells and applying the pass voltage to the unselected word lines:
- applying a precharge voltage to the bit line,
- wherein the boosting prevention voltage is greater than the precharge voltage.

10. The method of claim 7, wherein the equalizing voltage is greater than the read voltage and less than the pass voltage.

11. The method of claim 7, wherein the equalizing voltage is the same voltage as the pass voltage.

12. A method of operating a semiconductor memory device comprising a cell string including at least one drain select transistor that is connected to a bit line, at least one source select transistor that is connected to a common source line, and a plurality of memory cells that are connected between the drain select transistor and the source select transistor, the method comprising:
- applying a read voltage to a selected word line among a plurality of word lines that are respectively connected to the plurality of memory cells and applying a pass voltage to unselected word lines;
- applying a turn-on voltage to a source select line that is connected to the source select transistor;
- applying a turn-off voltage to a drain select line that is connected to the drain select transistor;
- transmitting a boosting prevention voltage to the source select transistor through the common source line; and
- applying the equalizing voltage to the plurality of word lines.

* * * * *